United States Patent
Klewer

(10) Patent No.: US 10,068,835 B2
(45) Date of Patent: Sep. 4, 2018

(54) PROCESS FLOW FOR A COMBINED CA AND TSV OXIDE DEPOSITION

(71) Applicant: GLOBALFOUNDRIES Inc., Grand Cayman (KY)

(72) Inventor: Christian Klewer, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/461,538

(22) Filed: Mar. 17, 2017

(65) Prior Publication Data

US 2017/0186669 A1 Jun. 29, 2017

Related U.S. Application Data

(62) Division of application No. 14/186,360, filed on Feb. 21, 2014.

(51) Int. Cl.
| | |
|---|---|
| H01L 21/768 | (2006.01) |
| H01L 23/48 | (2006.01) |
| H01L 29/06 | (2006.01) |
| H01L 23/532 | (2006.01) |
| H01L 23/528 | (2006.01) |
| H01L 29/78 | (2006.01) |

(52) U.S. Cl.
CPC ...... *H01L 23/481* (2013.01); *H01L 21/76801* (2013.01); *H01L 21/76843* (2013.01); *H01L 21/76877* (2013.01); *H01L 21/76898* (2013.01); *H01L 23/528* (2013.01); *H01L 23/53238* (2013.01); *H01L 29/0649* (2013.01); *H01L 29/78* (2013.01)

(58) Field of Classification Search
CPC ............. H01L 21/76898; H01L 23/481; H01L 21/768; H01L 23/48; H01L 21/283; H01L 29/76; H01L 23/58; H01L 21/311; H01L 21/44

See application file for complete search history.

(56) References Cited

U.S. PATENT DOCUMENTS

| | | | |
|---|---|---|---|
| 6,350,675 B1 * | 2/2002 | Chooi ................. | H01L 21/0274 257/E21.027 |
| 8,390,125 B2 * | 3/2013 | Tseng ................ | H01L 21/76898 257/741 |
| 2006/0151843 A1 * | 7/2006 | Yang ................. | H01L 21/26506 257/411 |

(Continued)

*Primary Examiner* — Daniel Luke
*Assistant Examiner* — Khatib Rahman
(74) *Attorney, Agent, or Firm* — Ditthavong & Steiner, P.C.

(57) ABSTRACT

A method of forming a TSV isolation layer and a transistor-to-BEOL isolation layer during a single deposition process and the resulting device are disclosed. Embodiments include providing a gate stack, with source/drain regions at opposite sides thereof, and an STI layer on a silicon substrate; forming a TSV trench, laterally separated from the gate stack, through the STI layer and the silicon substrate; forming an isolation layer on sidewalls and a bottom surface of the TSV trench and over the gate stack, the STI layer, and the silicon substrate; forming a TSV in the TSV trench; forming a dielectric cap over the isolation layer and the TSV; and forming a source/drain contact through the dielectric cap and the isolation layer down to the source/drain contract regions.

11 Claims, 13 Drawing Sheets

(56) References Cited

U.S. PATENT DOCUMENTS

| | | | |
|---|---|---|---|
| 2007/0187778 A1* | 8/2007 | Cannon | H01L 21/76224 257/390 |
| 2009/0085173 A1 | 4/2009 | Boemmels et al. | |
| 2009/0191708 A1* | 7/2009 | Kropewnicki | H01L 21/76898 438/667 |
| 2010/0127345 A1* | 5/2010 | Sanders | H01L 21/6835 257/528 |
| 2012/0322260 A1* | 12/2012 | Tsai | H01L 21/76898 438/667 |
| 2014/0077374 A1* | 3/2014 | Lin | H01L 21/76898 257/741 |
| 2015/0017798 A1* | 1/2015 | Zhang | H01L 21/76898 438/653 |

* cited by examiner

PROCESS FLOW FOR A COMBINED CA AND TSV OXIDE DEPOSITION

RELATED APPLICATION

The present application is a Divisional of application Ser. No. 14/186,360, filed on Feb. 21, 2014, which is incorporated herein by reference in its entirety.

TECHNICAL FIELD

The present disclosure relates to the manufacture of semiconductor devices with a through silicon via (TSV) module. The present disclosure is particularly applicable to three-dimensional (3D) integration in 130 nanometer (nm) technology nodes and beyond.

BACKGROUND

For 3D integration in 130 nm technologies and beyond, a via middle approach is commonly used. Consequently, the TSV-module is implemented as an independent module between middle-of-line (MOL) and back-end-of-line (BEOL) modules. However, with this process flow an additional oxide deposition step is required for TSV isolation such that there are two deposition steps, a source/drain contact isolation layer deposition and a TSV liner deposition. More specifically, approximately 200 nm of TSV trench isolation oxide at 100% step coverage is deposited on top of an isolation layer to form the TSV liner and then the TSV liner must be completely removed down to the contact layer during the TSV chemical mechanical polishing (CMP) process to form the TSV. This can lead to a decreased pre-metal dielectric (PMD) thickness and increased non-uniformity across the wafer. In addition, the full front-end-of-line (FEOL) and MOL oxide stack has to be opened during the TSV etch process.

A need therefore exists for methodology for forming a TSV isolation layer and a transistor-to-BEOL isolation layer during a single deposition process and the resulting device.

SUMMARY

An aspect of the present disclosure is a process of forming a TSV isolation layer and a transistor-to-BEOL isolation layer during a single deposition process.

Another aspect of the present disclosure is a device including a TSV liner and a CA-module formed in a single deposition layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a gate stack, with source/drain regions at opposite sides thereof, and a shallow trench isolation (STI) layer on a silicon substrate; forming a TSV trench, laterally separated from the gate stack, through the STI layer and the silicon substrate; forming an isolation layer on sidewalls and a bottom surface of the TSV trench and over the gate stack, the STI layer, and the silicon substrate; forming a TSV in the TSV trench; forming a dielectric cap over the isolation layer and the TSV; and forming a source/drain contact through the dielectric cap and the isolation layer down to the source/drain contract regions.

Aspects of the present disclosure include forming the isolation layer of TEOS. Other aspects include forming a nitride layer over the gate stack, the STI layer, and the silicon substrate prior to forming the TSV trench. Further aspects include forming the TSV trench by deep reactive-ion etching (DRIE). Another aspect includes forming the TSV trench by: etching a 0.5 micron ($\mu$) to 25$\mu$ wide first cavity in the nitride layer and the STI layer down to the silicon substrate; and etching a 0.5$\mu$ to 25$\mu$ wide and 20$\mu$ to 200$\mu$ deep second cavity in the silicon substrate below the first cavity. Additional aspects include forming the isolation layer on sidewalls of the TSV trench to a thickness of 15 nanometers (nm) to 500 nm and over the gate stack, the STI layer, and the silicon substrate to a thickness of 15 nm to 1000 nm. Other aspects include forming the TSV by: forming a barrier layer on the isolation layer; forming a seed layer on the barrier layer; filling a remainder of the TSV trench with a conductive material; and planarizing the conductive material, the barrier layer, and the seed layer down to the isolation layer. Further aspects include forming barrier layer of titanium (Ti), tantalum (Ta), titanium nitride (TiN), TaN/Ta, or a magnesium-based metal (MnM) to a thickness of 5 nm to 50 nm. Another aspect includes filling the remainder of the TSV trench with copper (Cu). Additional aspects include annealing the conductive material at a temperature of 100° C. to 450° C. Other aspects include planarizing the conductive material, the barrier layer, and the seed layer by CMP. Further aspects include forming the dielectric cap to a thickness of 10 nm to 200 nm. Another aspect includes forming the dielectric cap of a barrier low-k oxide (BLOK). Additional aspects include forming an additional isolation layer on the isolation layer in the TSV trench to thickness of 20 nm to 100 nm and on the isolation layer over the gate stack, the STI layer, and the silicon substrate to a thickness of 60 nm to 400 nm.

Another aspect of the present disclosure is a device including: a silicon substrate; a gate stack having source/drain regions at opposite sides thereof on the silicon substrate; an STI layer on the silicon substrate; a TSV trench formed through the STI layer and the silicon substrate, and laterally separated from the gate stack; an isolation layer formed on sidewalls and a bottom surface of the TSV trench and over the gate stack, the STI layer, and the silicon substrate; a TSV formed in the TSV trench; a dielectric cap formed over the isolation layer and the TSV; and a source/drain contact formed through the dielectric cap and the isolation layer down to the source/drain regions. Aspects of the device include a nitride layer being formed over the gate stack, the STI layer, and the silicon substrate prior to the TSV trench being formed. Other aspects include the isolation layer being formed on the sidewalls of the TSV trench to a thickness of 15 nm to 500 nm and over the gate stack, the STI layer, and the silicon substrate to a thickness of 15 nm to 1000 nm. Further aspects include the dielectric cap being formed to a thickness of 10 nm to 200 nm. Another aspect includes an additional isolation layer being formed on the isolation layer in the TSV trench to a thickness of 20 nm to 100 nm and on the isolation layer over the gate stack, the STI layer, and the silicon substrate to a thickness of 60 nm to 400 nm.

Another aspect of the present disclosure is a method including: providing a gate stack, with source/drain regions at opposite sides thereof, and an STI layer on a silicon substrate; forming a nitride layer over the gate stack, the STI layer, and the silicon substrate; forming a TSV trench, laterally separated from the gate stack, through the nitride layer, the STI layer, and the silicon substrate with a mask; forming a first isolation layer on sidewalls of the TSV trench to a thickness of 15 nm to 500 nm and over the nitride layer to a thickness of 15 nm to 1000 nm; forming a second isolation layer on the first isolation layer in the TSV trench to a thickness of 20 nm to 100 nm and over the first isolation layer over the nitride layer to a thickness of 60 nm to 400 nm; forming a barrier/seed layer on the second isolation layer in the TSV trench and over the second isolation layer over the nitride layer; filing a remainder of the TSV trench with a conductive material; annealing the conductive material at 100° C. to 450° C.; planarizing the conductive material, the second isolation layer, the barrier layer, and the seed layer down to the second isolation layer; forming a dielectric cap over the second isolation layer, the barrier layer, the seed layer, and the conductive material to a thickness of 10 nm to 200 nm; and forming a source/drain contact through the dielectric cap, the first and second isolation layers, and the nitride layer down to the source/drain contract regions. Other aspects include planarizing the second isolation layer to a final thickness of 50 nm to 250 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of two separate deposition steps, e.g., an isolation layer deposition and TSV liner deposition, attendant upon forming a TSV for 3D integration. By forming a TSV isolation layer and a transistor-to-BEOL isolation layer during a single deposition process, the problems of PMD thickness and non-uniformity across the wafer can be reduced. In addition, the overall cost may be reduced by removing the TSV CMP stop layer and the isolation layer CMP step and by reducing the number of inspection/measurement steps, the oxide open step and the thickness of the TSV mask, all associated with previous process flows.

Methodology in accordance with embodiments of the present disclosure includes providing a gate stack, with source/drain regions at opposite sides thereof, and an STI layer on a silicon substrate. A TSV trench, laterally separated from the gate stack, is formed through the STI layer and the silicon substrate. An isolation layer is formed on sidewalls and a bottom surface of the TSV trench and over the gate stack, the STI layer, and the silicon substrate. A TSV is formed in the TSV trench. A dielectric cap is formed over the isolation layer and the TSV. A source/drain contact is formed through the dielectric cap and the isolation layer down to the source/drain contract regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
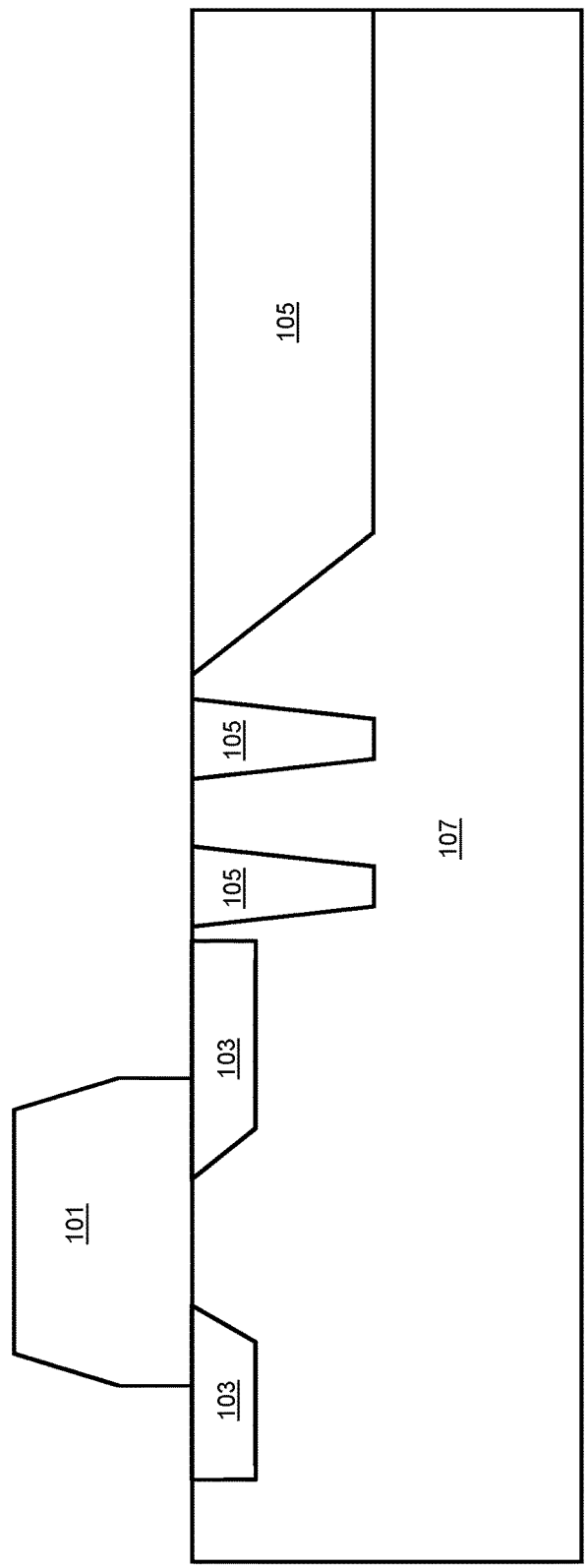
FIGS. 1 through 13 schematically illustrate sequential steps of a method of forming a TSV isolation layer and a transistor-to-BEOL isolation layer during a single deposition process, in accordance with an exemplary embodiment.
Figure 2:
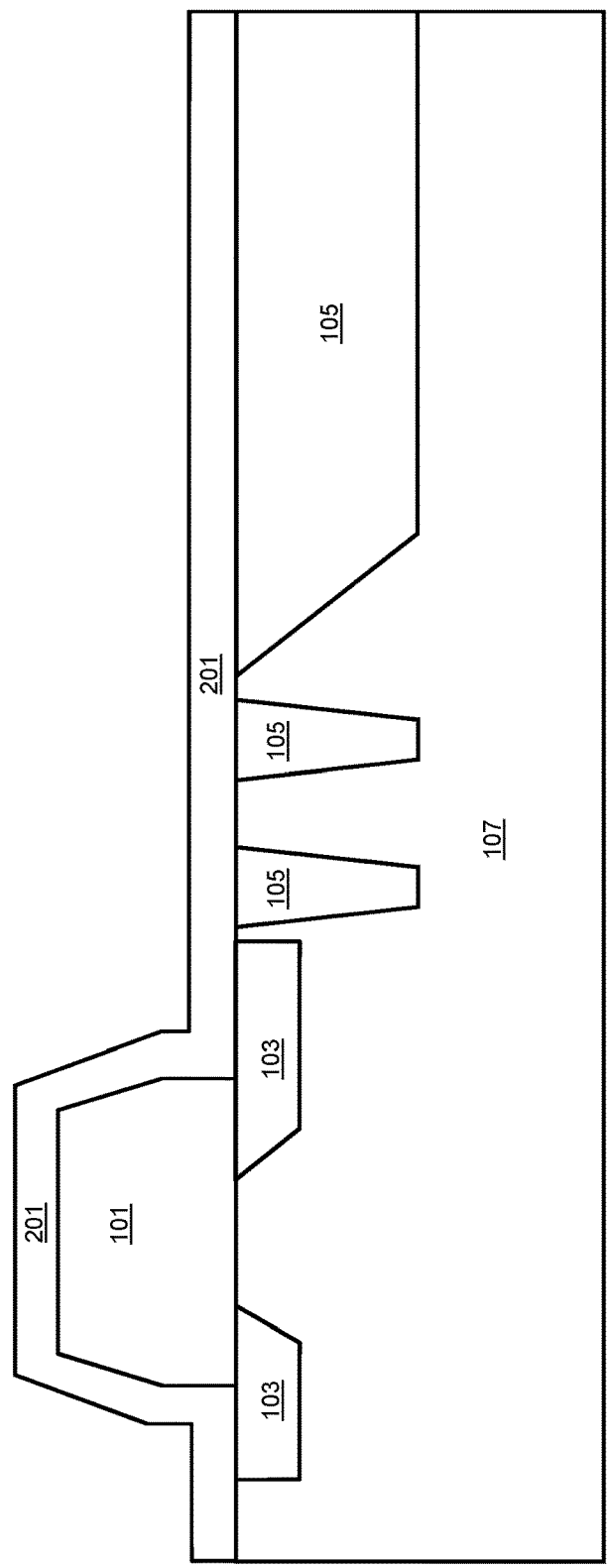

FIGS. 1 through 13 schematically illustrate sequential steps of a method of forming a TSV isolation layer and a transistor-to-BEOL isolation layer during a single deposition process, in accordance with an exemplary embodiment. Adverting to FIG. 1, a gate stack 101 with source/drain regions 103 at opposite sides thereof and an STI layer 105 are formed on a silicon substrate 107. Next, a nitride layer 201, e.g., TPEN, NPEN, or CPEN, is formed to a thickness of 20 nm to 40 nm over the gate stack 101, the STI layer 105, and the silicon substrate 107, as depicted in FIG. 2. Alternatively, the nitride layer 201 may be removed from the process flow.

Figure 3:
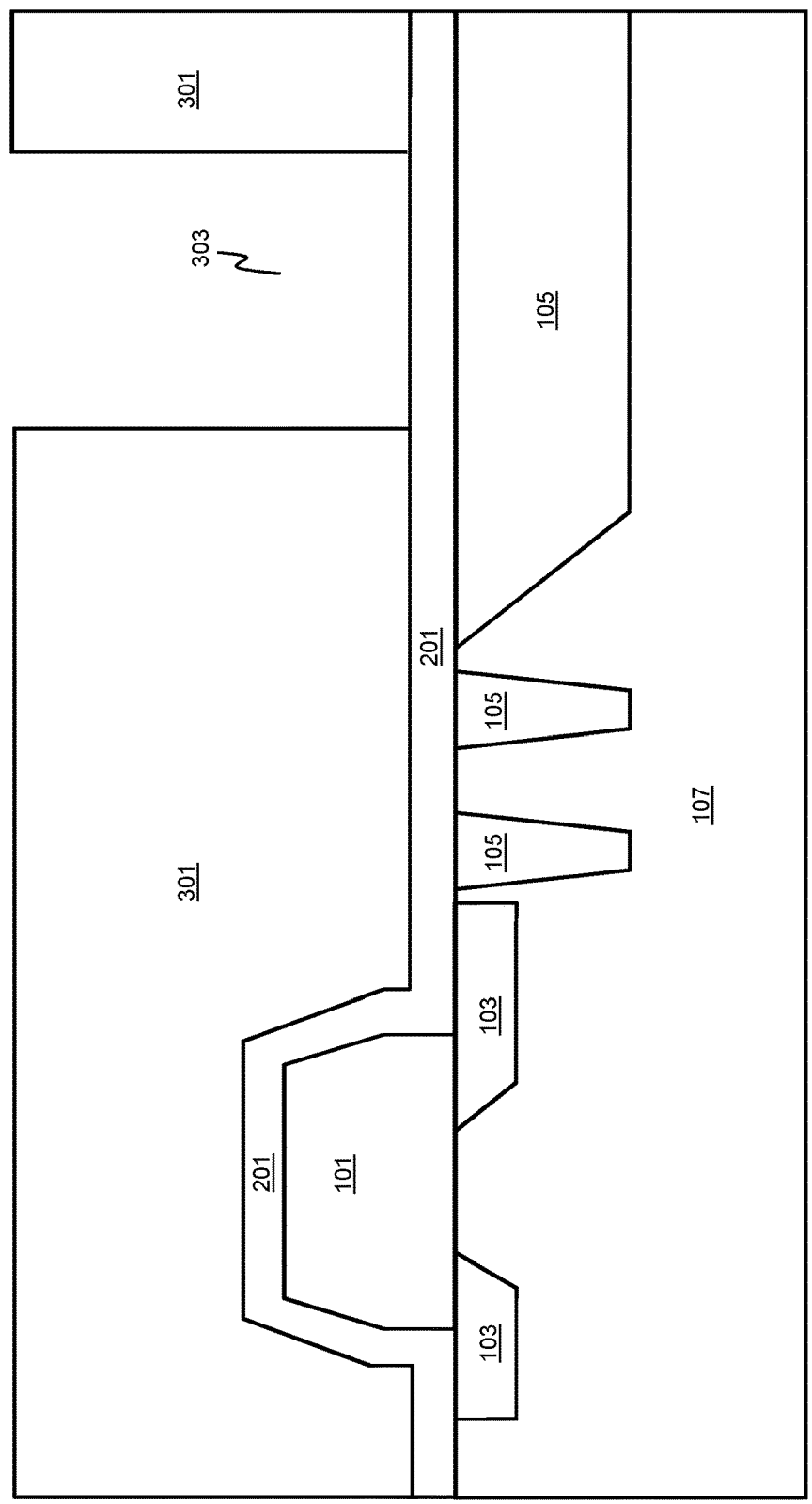
Figure 4:
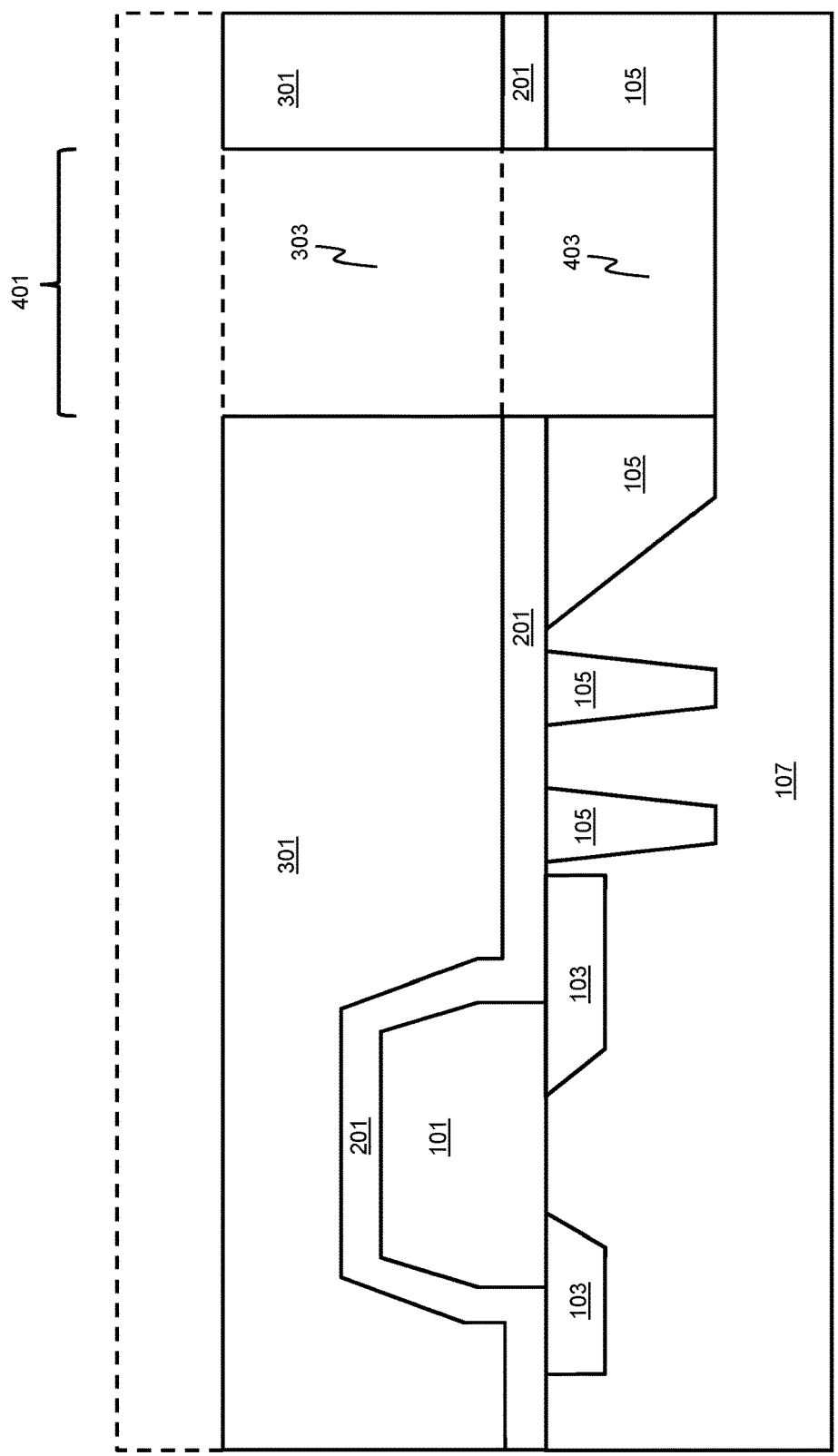
Figure 5:
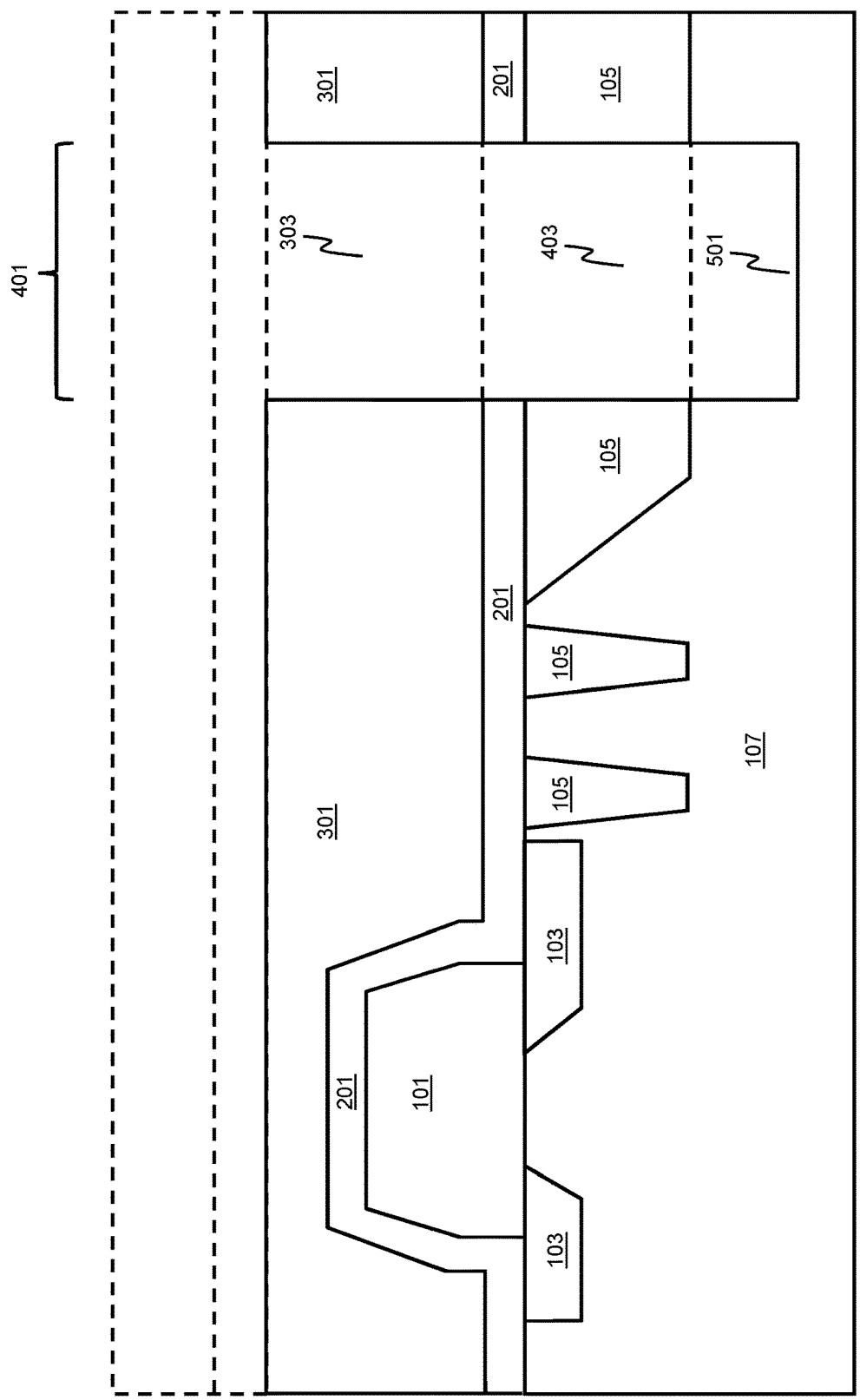

Adverting to FIG. 3, a TSV mask/resist layer 301 is formed over the nitride layer 201. Next, a 0.5µ to 25µ wide opening 303, laterally separated from the gate stack 101, is patterned in the resist layer 301. A TSV trench 401 is then formed by etching, e.g., by DRIE, a 0.5µ to 25µ wide cavity 403 in the nitride layer 201 and the STI layer 105 down to the silicon substrate 107, as illustrated in FIG. 4. Consequently, 2.5µ to 4.5µ of the resist layer 301 are lost due to the etching process. Adverting to FIG. 5, the TSV trench 401 is further formed by etching, e.g., by DRIE, a 0.5µ to 25µ wide and 20µ to 200µ deep cavity 501 into the silicon substrate 107 below the cavity 403. As a result, a further 1µ to 2µ of the resist layer 301 are lost due to the subsequent etching process. The minimal resist loss during the TSV trench 401 formation processes allows the overall thickness of the TSV mask/resist layer 301 to be reduced, which reduces the overall cost.

Figure 6:
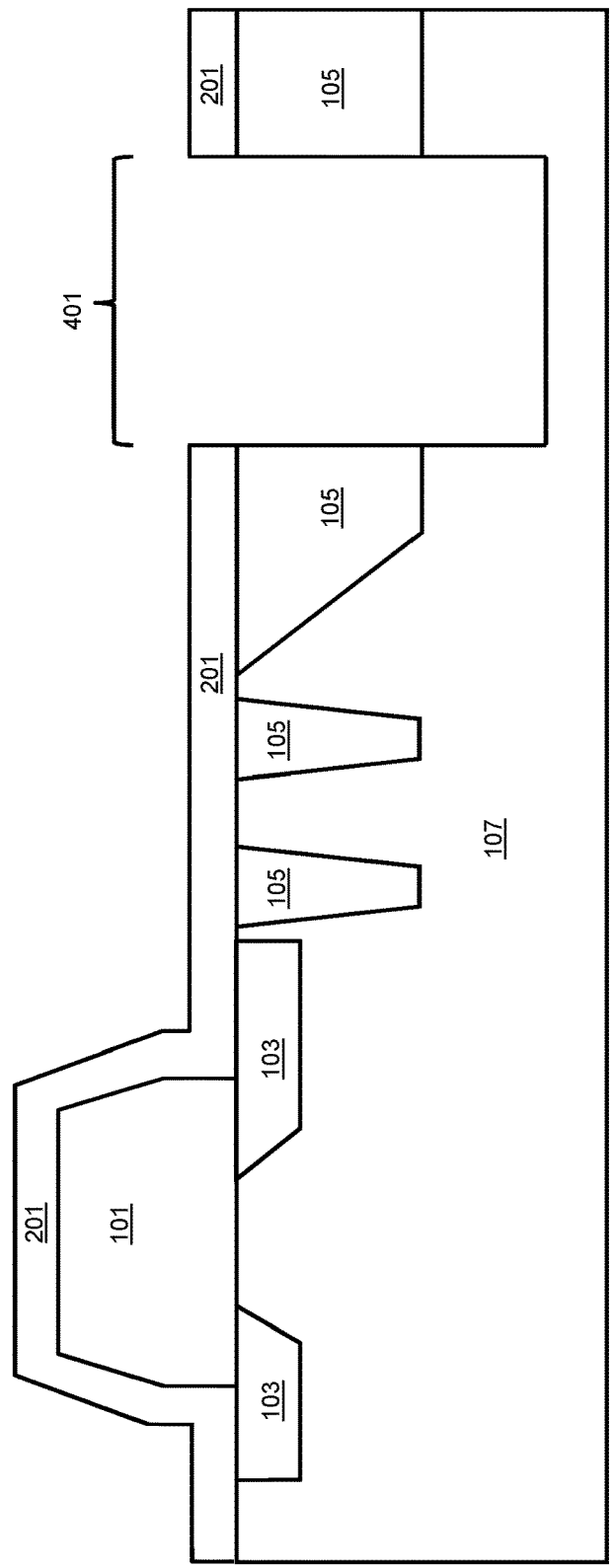
Figure 7:
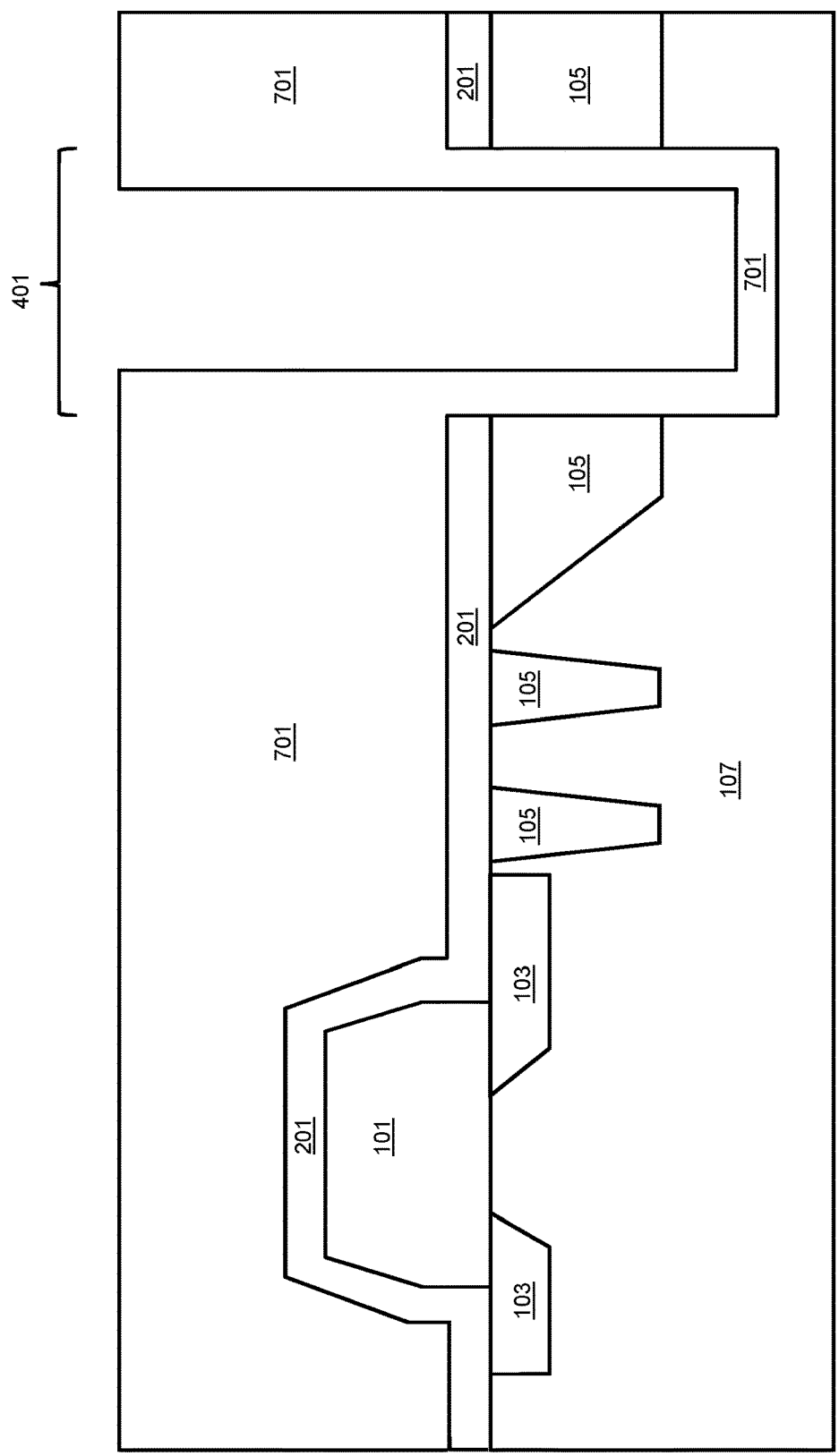
Figure 8:
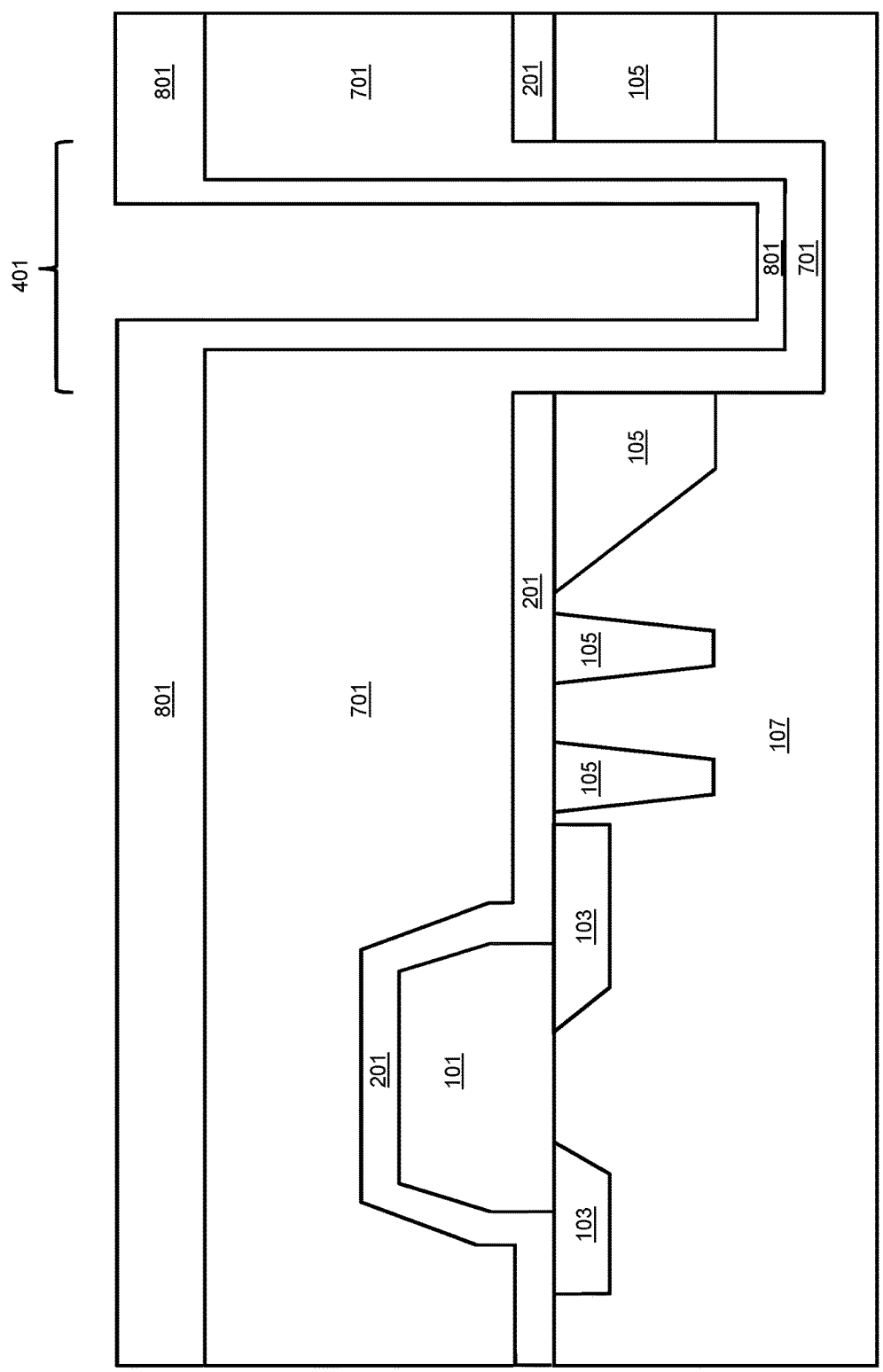

Adverting to FIG. 6, the TSV mask resist 301 is stripped and the TSV trench 401 is cleaned (not shown for illustrative convenience). Next, an isolation layer 701, e.g., tetraethyl orthosilicate (TEOS), is formed to a thickness of 15 nm to 500 nm, e.g., 200 nm, on the sidewalls of the TSV trench 401 and to a thickness of 15 nm to 1000 nm, e.g., 450 nm, on the nitride layer 201, as depicted in FIG. 7. An optional isolation layer 801, e.g., TEOS, may also be formed in the TSV trench 401 to a thickness of 20 nm to 100 nm and on the isolation layer 701 over the nitride layer 201 to a thickness of 60 nm to 400 nm, as depicted in FIG. 8.

Figure 9:
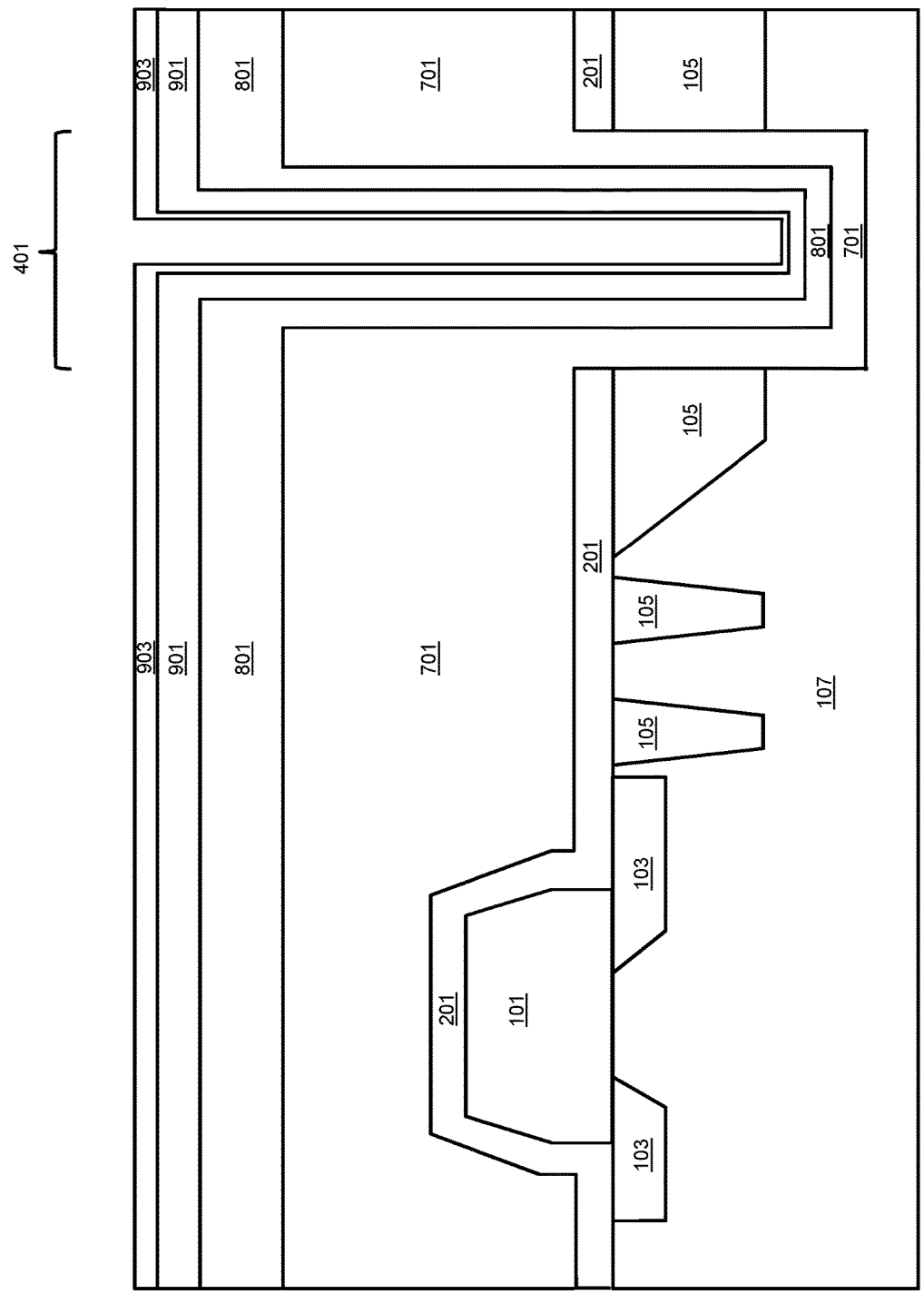
Figure 10:
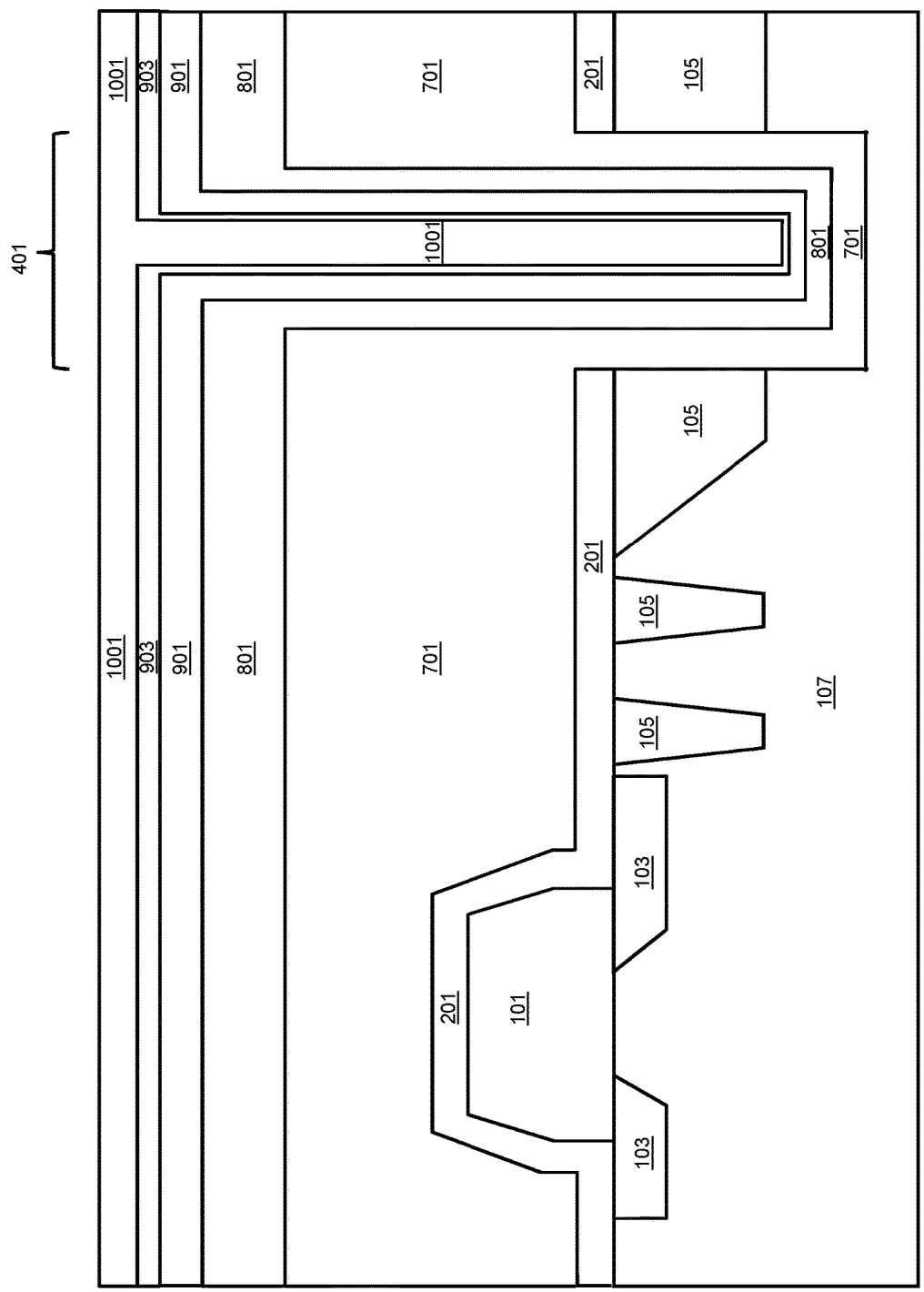
Figure 11:
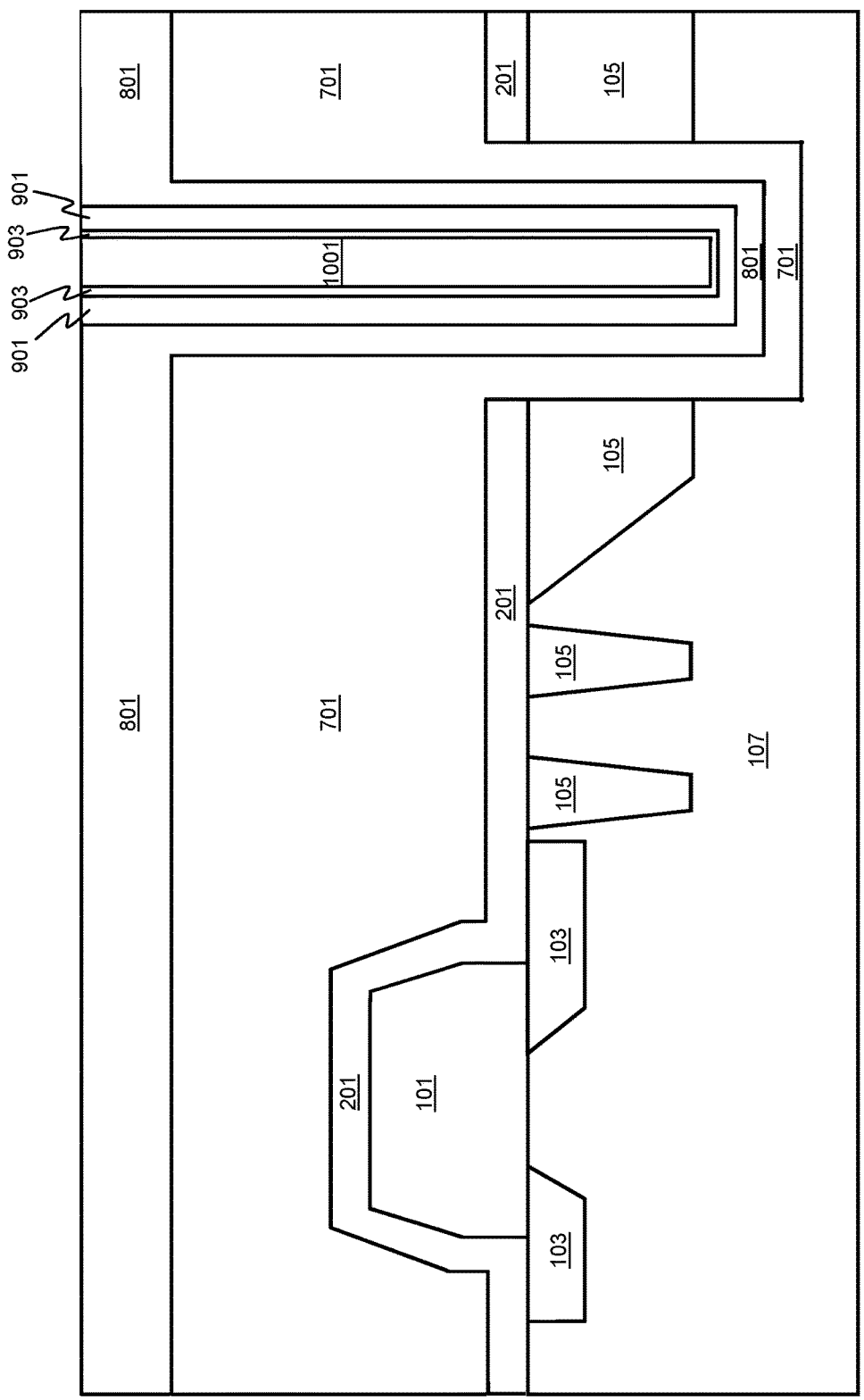
Figure 12:
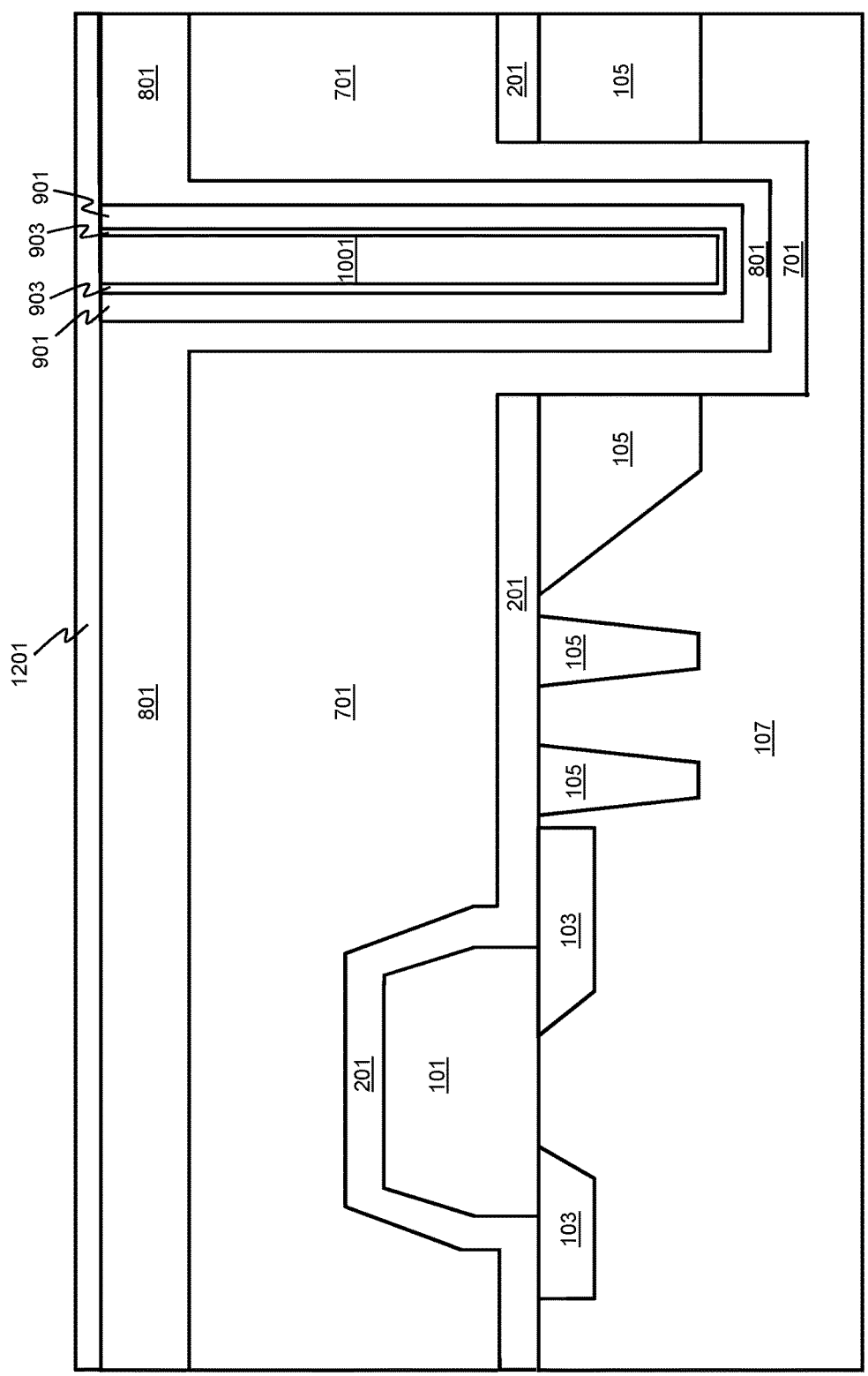

Next, a TSV is formed by first forming a barrier layer 901, e.g., Ti, Ta, TiN, TaN/Ta, or MNM, on the optional isolation layer 801 to a thickness of 5 nm to 50 nm, as depicted in FIG. 9. A seed layer 903, e.g., Cu, is deposited by physical vapor deposition (PVD) to a thickness of 50 nm to 800 nm. Thereafter, the remainder of the TSV trench 401 is filled with a conductive material 1001, e.g., Cu, as illustrated in FIG. 10. The conductive material 1001 is then annealed at a temperature of 100° C. to 450° C. (not shown for illustrative convenience). The temperature may vary depending on the conductive material used to fill the TSV trench 401. Adverting to FIG. 11, the conductive material 1001, the barrier layer 901, the seed layer 903, and the optional isolation layer 801 are planarized, e.g., by CMP, until the final thickness of the optional isolation layer 801 is 50 nm to 250 nm. Alternatively, when the optional isolation layer 801 is absent, the conductive material 1001, the barrier layer 901, the seed layer 903, and the isolation layer 701 are planarized, e.g., by CMP, until the final thickness of the isolation layer 701 is 20 nm to 950 nm (not shown for illustrative convenience). Next, a dielectric cap 1201, e.g., BLOK, is formed on the conductive material 1001, the barrier layer 901, the seed layer 903, and the optional isolation layer 801 to a thickness of 10 nm to 200 nm, as depicted in FIG. 12.

Figure 13:
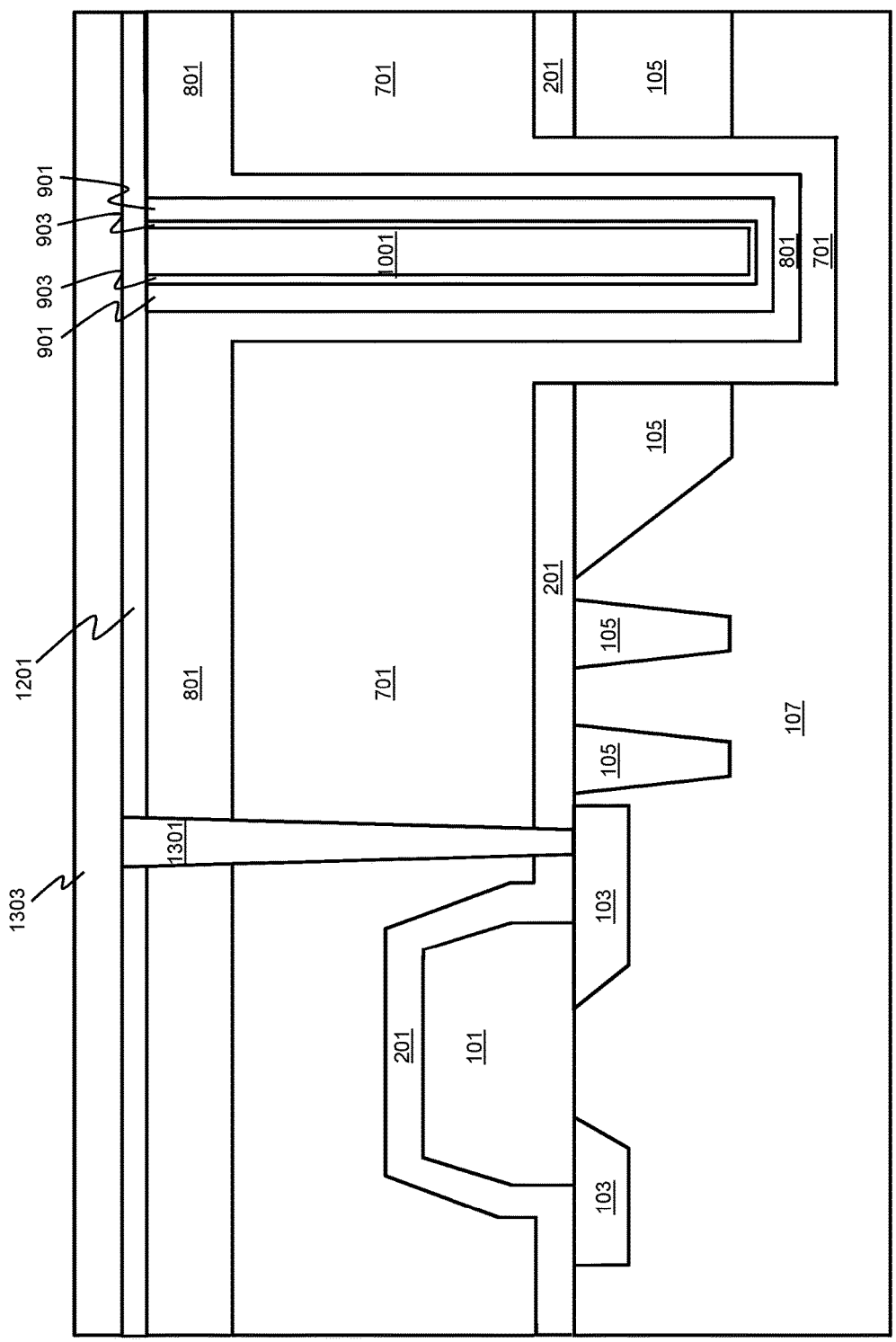

Adverting to FIG. 13, a contact 1301, e.g., filled with tungsten, is formed in a conventional manner through the optional isolation layer 801, the isolation layer 701, and the optional nitride layer 201 down to the source/drain region 103. An additional dielectric cap 1303, e.g., BLOK, is then deposited on the dielectric cap 1201.

The embodiments of the present disclosure can achieve several technical effects including reducing the problem of PMD thickness and non-uniformity across a wafer by forming the TSV isolation layer and the transistor to BEOL isolation layer during a single deposition process. In addition, the overall cost may be reduced by removing the TSV CMP stop layer and the isolation layer CMP step and by reducing the number of inspection/measurement steps, the oxide open step and the TSV mask resist thickness, all associated with prior process flows. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices having a TSV module, particularly those intended for 3D integration in 130 nm technology nodes and below.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a gate stack, with source/drain regions at opposite sides thereof, and a shallow trench isolation (STI) layer on a silicon substrate;
    a nitride layer directly over the gate stack, the STI layer, and the silicon substrate;
    a through silicon via (TSV) trench, laterally separated from the gate stack, through the STI layer and the silicon substrate;
    a tetraethyl orthosilicate (TEOS) isolation layer formed on an entirety of the nitride layer without any intervening layer between the TEOS isolation layer and the nitride layer when viewed in cross-section, such that the TEOS isolation layer is formed on sidewalls and a bottom surface of the TSV trench and over the gate stack, the STI layer, and the silicon substrate;
    a TSV formed in the TSV trench;
    a dielectric cap formed over the TEOS isolation layer and the TSV; and
    a source/drain contact formed through the dielectric cap and the TEOS isolation layer down to the source/drain contract regions,
    wherein an additional TEOS isolation layer is formed on the TEOS isolation layer in the TSV trench.

2. The device according to claim 1, wherein the nitride layer is formed over the gate stack, the STI layer, and the silicon substrate prior to the TSV trench being formed.

3. The device according to claim 1, wherein the TEOS isolation layer is formed on the sidewalls of the TSV trench to a thickness of 15 nanometers (nm) to 500 nm.

4. The device according to claim 3, wherein the TEOS isolation layer is formed over the gate stack, the STI layer, and the silicon substrate to a thickness of 15 nm to 1000 nm.

5. The device according to claim 1, wherein the dielectric cap is formed to a thickness of 10 nm to 200 nm.

6. The device according to claim 1, wherein the additional isolation layer is formed on the TEOS isolation layer over the gate stack, the STI layer, and the silicon substrate to a thickness of 60 nm to 400 nm.

7. The device according to claim 1, wherein the TSV comprises:
    a barrier layer on the TEOS isolation layer;
    a seed layer on the barrier layer; and
    a conductive material filling the trench of the TSV.

8. The device according to claim 7, wherein the barrier layer comprises titanium (Ti), tantalum (Ta), titanium nitride (TiN), TaN/Ta, or a magnesium-based metal (MnM) to a thickness of 5 nm to 50 nm.

9. The device according to claim 1, wherein the dielectric cap comprises a barrier low-k oxide (BLOK).

10. A device comprising:
    a gate stack, with source/drain regions at opposite sides thereof, and a shallow trench isolation (STI) layer on a silicon substrate;
    a nitride layer over the gate stack, the STI layer, and the silicon substrate;
    a through silicon via (TSV) trench, laterally separated from the gate stack, through the nitride layer, the STI layer, and the silicon substrate;
    a first isolation layer on sidewalls of the TSV trench to a thickness of 15 nanometers (nm) to 500 nm and over the nitride layer to a thickness of 15 nm to 1000 nm;
    a second isolation layer on the first isolation layer in the TSV trench to a thickness of 20 nm to 100 nm and over the first isolation layer over the nitride layer to a thickness of 60 nm to 400 nm;

a barrier layer on the second isolation layer in the TSV trench and over the second isolation layer over the nitride layer;

a seed layer on the barrier layer;

a conductive material filling a remainder of the TSV trench;

a dielectric cap formed over the second isolation layer, the barrier/seed layer, and the conductive material to a thickness of 10 nm to 200 nm; and a source/drain contact through the dielectric cap, the first and second isolation layers, and the nitride layer down to the source/drain contract regions, wherein the first isolation layer and second isolation layer consist of tetraethyl orthosilicate (TEOS).

11. The device according to claim 10, wherein the second isolation layer has a thickness of 50 nm to 250 nm.

* * * * *